(12) United States Patent
Liao et al.

(10) Patent No.: US 11,105,842 B2
(45) Date of Patent: Aug. 31, 2021

(54) METHOD AND CIRCUITRY FOR OPEN LOAD DETECTION

(71) Applicant: TEXAS INSTRUMENTS INCORPORATED, Dallas, TX (US)

(72) Inventors: JianQuan Liao, Shanghai (CN); GuangYao Zhou, Shanghai (CN); Yuqing Yang, Plano, TX (US); Yongyi Wu, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 20 days.

(21) Appl. No.: 16/150,581

(22) Filed: Oct. 3, 2018

(65) Prior Publication Data
US 2019/0361068 A1   Nov. 28, 2019

Related U.S. Application Data (63) Continuation of application No. PCT/CN2018/087882, filed on May 22, 2018.

(51) Int. Cl.
  *G01R 31/28* (2006.01)
  *G01R 31/50* (2020.01)
  (Continued)

(52) U.S. Cl.
  CPC ... *G01R 31/2812* (2013.01); *G01R 19/16519* (2013.01); *G01R 31/2844* (2013.01);
  (Continued)

(58) Field of Classification Search
  CPC .............. G01R 31/2812; G01R 31/50; G01R 19/16519; G01R 31/2844; G01R 31/54;
  (Continued)

(56) References Cited

U.S. PATENT DOCUMENTS

| 5,592,097 A * | 1/1997 | Shimizu | G01R 31/50 |
|---|---|---|---|
| | | | 324/546 |
| 7,548,070 B2 * | 6/2009 | Forster | G01R 19/165 |
| | | | 324/543 |

(Continued)

OTHER PUBLICATIONS

TLV320DAC3100-Q1 Diagnostic Test for Automotive Applications with Open Loads, Application Report, Texas Instruments, 2013 (Year: 2013).*

(Continued)

*Primary Examiner* — Daniel R Miller
(74) *Attorney, Agent, or Firm* — John R. Pessetto; Charles A. Brill; Frank D. Cimino (57) ABSTRACT

In described examples, a method of determining whether there is an open load fault in a test circuit includes closing a first switch to couple an input voltage to a first LC filter in which a first capacitor is coupled to a ground, the first LC filter coupled to a first terminal coupled to the test circuit; and closing a second switch to couple the input voltage to a second LC filter in which a second capacitor is coupled to the ground, the second LC filter coupled to a second terminal coupled to the test circuit. After the LC filters charge to the input voltage, the second switch is opened, and the second capacitor is discharged across a discharge resistor for a specified discharge time. The voltage across the discharge resistor falling below a reference voltage indicates that there is an open load fault in the test circuit.

17 Claims, 6 Drawing Sheets

(51) Int. Cl.
 *G01R 19/165* (2006.01)
 *H04R 3/00* (2006.01)
 *H03K 17/693* (2006.01)

(52) U.S. Cl.
 CPC ........... *G01R 31/50* (2020.01); *H03K 17/693* (2013.01); *H04R 3/007* (2013.01)

(58) Field of Classification Search
 CPC ...... H04R 3/007; H03K 17/693; H03K 17/18; H03F 1/52; H03F 3/183; H03F 3/2173
 See application file for complete search history.

(56) References Cited

U.S. PATENT DOCUMENTS

| | | | |
|---|---|---|---|
| 9,948,196 B2 | 4/2018 | Kikuchi et al. | |
| 2013/0136278 A1 | 5/2013 | Quilter | |
| 2014/0070784 A1 | 5/2014 | Lynch et al. | |
| 2017/0250654 A1* | 8/2017 | Cope | H03F 3/2173 |
| 2018/0026624 A1* | 1/2018 | Baik | G01R 31/50 |
| | | | 361/42 |

OTHER PUBLICATIONS

International Search Report in corresponding PCT Application No. PCT/CN2018/087882, dated Feb. 12, 2019 (4 pages).

* cited by examiner

| $R_{OPEN}(\Omega)$ | 120 | 121 | 125 | 130 | 150 | 200 | 400 | 800 | 1600 |
|---|---|---|---|---|---|---|---|---|---|
| t (ms) | ∞ | 1.71 | 1.19 | 0.98 | 0.71 | 0.54 | 0.42 | 0.39 | 0.37 |

METHOD AND CIRCUITRY FOR OPEN LOAD DETECTION

BACKGROUND

The present application relates to electronic circuitry, and more particularly to a method and circuitry for detecting an open load fault.

Figure 1:
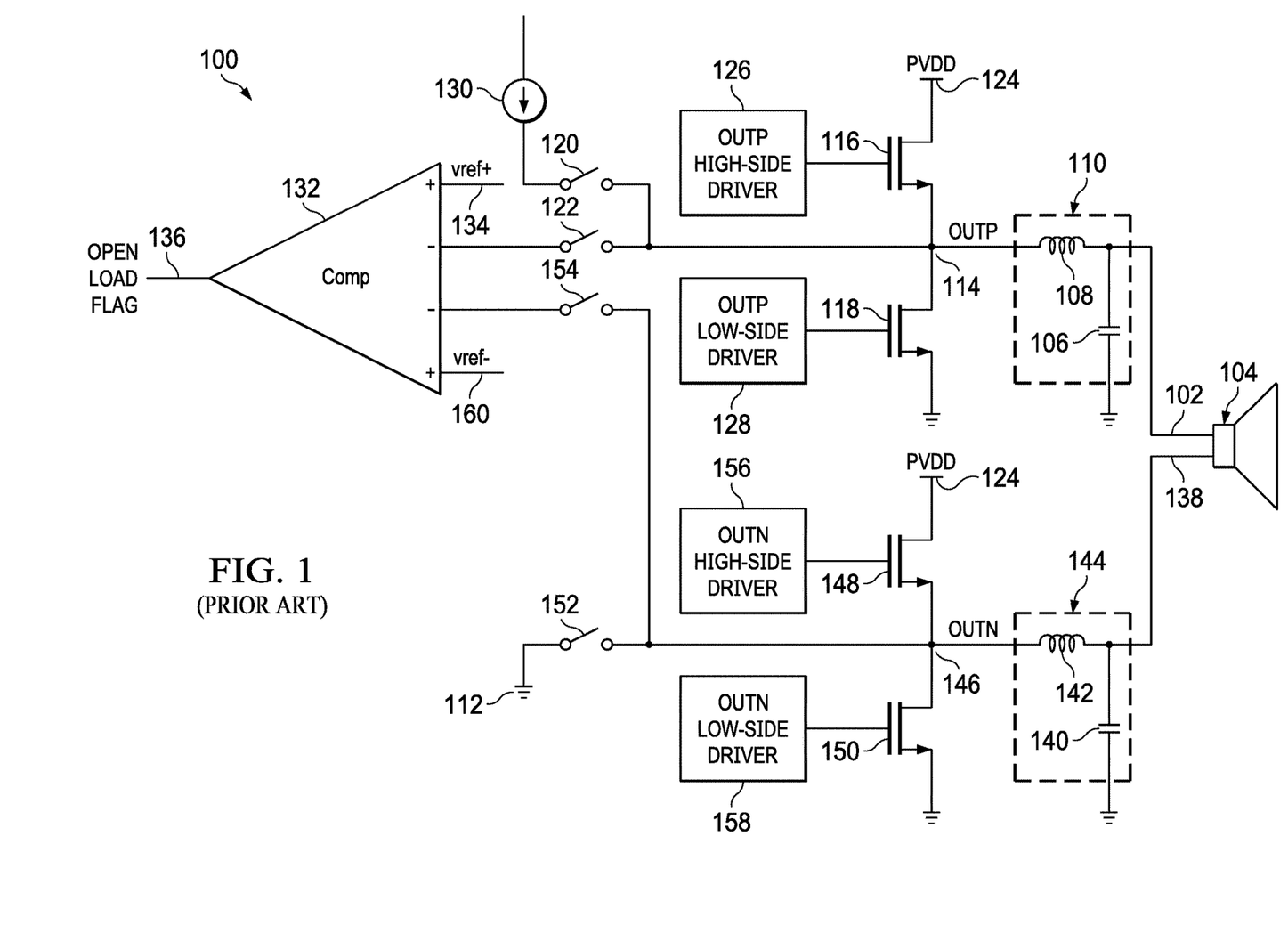
FIG. 1 schematically shows an example of a prior art circuit for detecting an open load fault.

FIG. 1 schematically shows an example of a prior art circuit 100 for detecting an open load fault. As shown in FIG. 1, an OUTP terminal 102 of a speaker 104 is connected to a first terminal of an OUTP capacitor 106 and an OUTP inductor 108. (Components herein are labelled as being "OUTP" or "OUTN" depending on whether they are coupled to the same terminal 102, 138 of the speaker 104 as an OUTP node 114, or as an OUTN node 146. "OUTP" refers to the positive polarity of an output extracted at the OUTP node 114, and "OUTN" refers to the negative polarity of an output extracted at the OUTN node 146; speaker terminals will generally not have polarity. The OUTP node 114, OUTN terminal 138, and OUTN node 146 are described below.) The capacitor 106 and the inductor 108 together comprise an OUTP LC filter 110. The second terminal of the OUTP capacitor 106 is connected to a ground 112. A first terminal of the OUTP inductor 108 is connected to an OUTP node 114. The OUTP node 114 is connected to the source of an OUTP high-side NMOS transistor 116, the drain of an OUTP low-side transistor 118, a first terminal of an input switch 120 and a first terminal of an OUTP comparator switch 122. The drain of the OUTP high-side transistor 116 is connected to a voltage input PVDD 124. The gate of the OUTP high-side transistor 116 is connected to an OUTP high-side driver 126. The source of the OUTP low-side transistor 118 is connected to the ground 112. The gate of the OUTP low-side transistor 118 is connected to an OUTP low-side driver 128. A second terminal of the input switch 120 is connected to an input current 130. A second terminal of the OUTP comparator switch 122 is connected to a first (e.g., inverting) input to a comparator 132, and an OUTP reference voltage vref+ 134 is connected to a second (e.g., non-inverting) input to the comparator 132, so that the voltage at the OUTP node 114 is subtracted from the OUTP reference voltage 134 when the OUTP comparator switch 122 is closed (vref+ minus OUTP).

An OUTN terminal 138 of the speaker 104 is connected to a first terminal of an OUTN capacitor 140 and a first terminal of an OUTN inductor 142. The OUTN capacitor 140 and the OUTN inductor 142 together comprise an OUTN LC filter 144. A second terminal of the OUTN capacitor 140 is connected to the ground 112. A second terminal of the OUTN inductor 108 is connected to the OUTN node 146. The OUTN node 146 is connected to the source of an OUTN high-side transistor 148, the drain of an OUTN low-side transistor 150, a first terminal of a ground switch 152, and a first terminal of an OUTN comparator switch 154. The drain of the OUTN high-side transistor 148 is connected to the voltage input PVDD 124. The gate of the OUTN high-side transistor 148 is connected to an OUTN high-side driver 156. The source of the OUTN low-side transistor 150 is connected to the ground 112. The gate of the OUTN low-side transistor 150 is connected to an OUTN low-side driver 158. A second terminal of the ground switch 152 is connected to the ground 112. A second terminal of the OUTN comparator switch 154 is connected to a third (e.g., inverting) input to the comparator 132, and an OUTN reference voltage vref- 160 is connected to a fourth (e.g., non-inverting) input to the comparator 132, so that the voltage at the OUTN node 146 is subtracted from the OUTN reference voltage 160 when the OUTN comparator switch 154 is closed (vref- minus OUTN). Depending on the comparison between the differential voltages produced using the inputs to the comparator, vref+ minus OUTP and vref- minus OUTN, the comparator 132 outputs an open load flag 136 which indicates whether an open load fault (further described below) is detected.

Transistors used in the circuit 100 of FIG. 1 can be, for example, LDMOS transistors. The OUTP high-side and low-side transistors 116, 118, plus the OUTN high-side and low-side transistors 148, 150, along with the circuit portion connecting the OUTP and OUTN transistors 116, 118, 148, 150, form an H bridge.

Open load detection is used to determine whether the OUTP node 114 is coupled to the OUTN node 146 via the speaker 104—the load—as expected. Accordingly, open load detection determines whether the OUTP terminal 102 is properly connected, whether the OUTN terminal 138 is properly connected, and whether the speaker 104 contains no breaks in its internal circuits (no unintended open circuits). The circuit 100 of FIG. 1 can be used to determine whether these conditions are met. If these conditions are not met, then an open load fault is detected.

To determine whether there is an open load fault using the circuit 100 of FIG. 1, the circuit 100 injects current and measures voltage. The OUTN node 146 is connected to ground 112 by closing the ground switch 152, and a current pulse is injected from the OUTP node 114 by closing the input switch 120 to connect the input current 130 to the OUTP node 114. The injected current flows through the OUTP LC filter 110, to the speaker 104, to the OUTN LC filter 144, to the OUTN node 146, to ground 112. After a delay to allow the signal transmitted through the circuit 100 to settle, the OUTP comparator switch 122 and the OUTN comparator switch 154 are closed. The comparator 132 compares the differential voltage produced by subtracting the voltage at the OUTP node 114 from the OUTP reference voltage 134, against the differential voltage produced by subtracting the voltage at the OUTN node 146 from the OUTN reference voltage 160. These differential voltages will be significantly different if there is an open load condition (accordingly, a fault), than they will be if there is no open load condition (accordingly, no fault). The open load flag 136 indicates the results of this comparison, and accordingly, whether there is an open load fault.

SUMMARY

In described examples, a method of determining whether there is an open load fault in a test circuit includes closing a first switch to couple an input voltage to a first LC filter in which a first capacitor is coupled to a ground, the first LC filter coupled to a first terminal coupled to the test circuit; and closing a second switch to couple the input voltage to a second LC filter in which a second capacitor is coupled to the ground, the second LC filter coupled to a second terminal coupled to the test circuit. There is then a wait for the first and second LC filters to charge to the input voltage. After the wait, while the first switch is kept closed, the second switch is opened, and the second capacitor is discharged across a discharge resistor for a specified discharge time. A voltage across the discharge resistor is then compared to a reference voltage, and if the voltage across the discharge resistor falls below the reference voltage, an indication is outputted that there is an open load fault in the test circuit.

DETAILED DESCRIPTION

Figure 2:
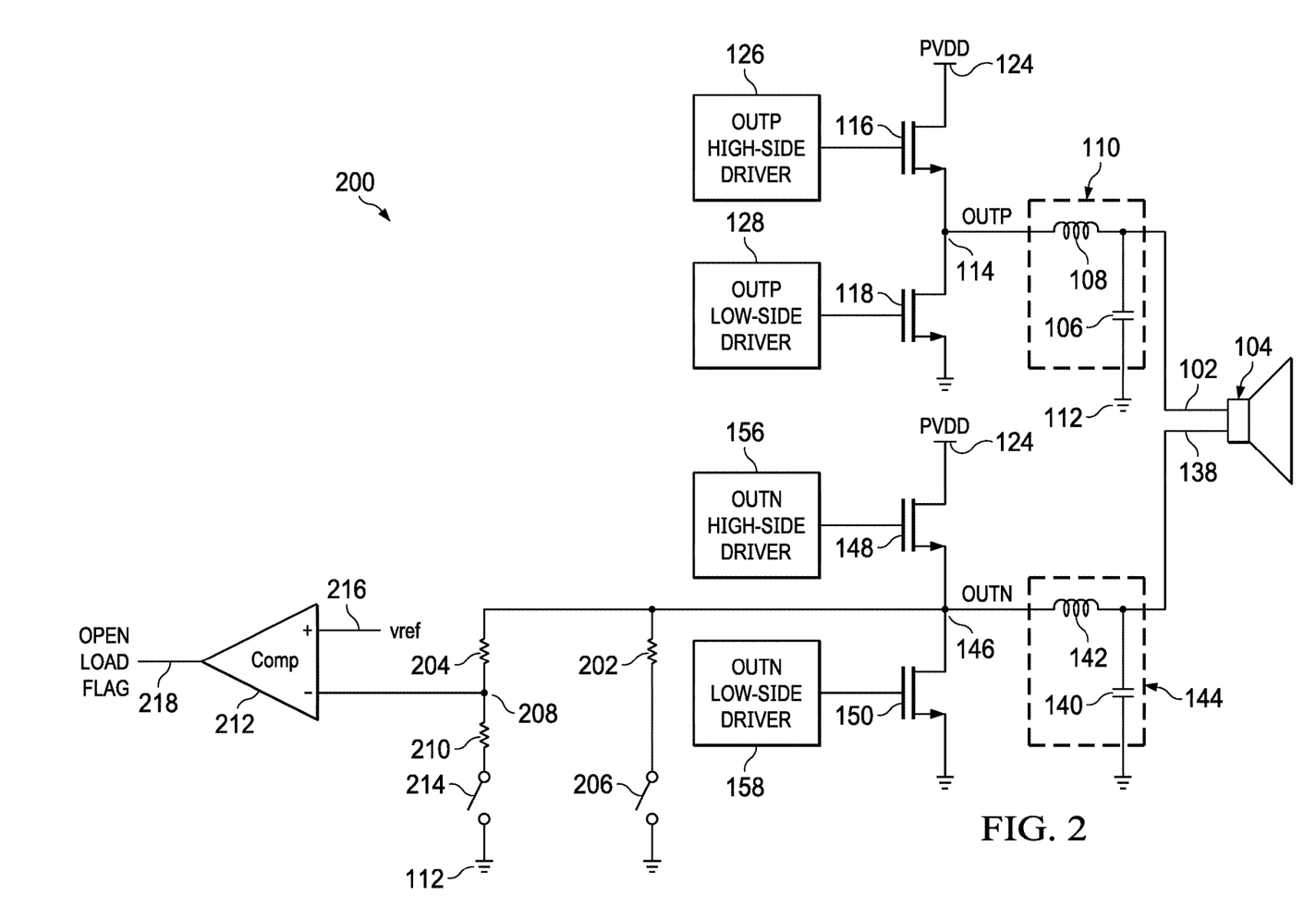
FIG. 2 schematically shows an example of a circuit for detecting an open load fault.

FIG. 2 schematically shows an example of a circuit 200 for detecting an open load fault. The circuit 200 of FIG. 2 shares various aspects with the circuit 100 of FIG. 1, so like reference numbers from FIG. 1 are carried forth into FIG. 2 for such items. The circuit 200 of FIG. 2 does not include various aspects of the circuit 100, including the input current 130 and input switch 120, the comparator 132 and comparator switch 122, and the output switch 152 and the connection between OUTN 152 and ground 112 via the output switch 152. As shown in FIG. 2, the OUTN node 146 is connected to a first terminal of a discharge resistor 202 with resistance $R_{DIS}$ and a first terminal of a first OUTN voltage-divider resistor 204. A second terminal of the discharge resistor 202 is connected to a first terminal of a discharge switch 206, which has its second terminal connected to the ground 112. The second terminal of the first OUTN voltage-divider resistor 204 is connected to a test voltage node 208. The test voltage node 208 is also connected to a first terminal of a second OUTN voltage-divider resistor 210 and to a first (for example, inverting) input to a comparator 212. A second terminal of the second OUTN voltage-divider resistor 210 is connected to a first terminal of a comparator switch 214, which has its second terminal connected to the ground 112. A reference voltage vref 216 is connected to a second (for example, non-inverting) input to the comparator 212, so that the voltage at the OUTN node 146, once divided, is compared to the reference voltage 216 when the comparator switch 214 is closed. As further detailed later, depending on the comparison based on the voltage at the OUTN node 114 and the reference voltage 216, the comparator 212 outputs an open load flag 218 which indicates whether an open load fault is detected. The circuit 200 of FIG. 2 can be implemented using, for example, a class D amplifier.

Figure 3:
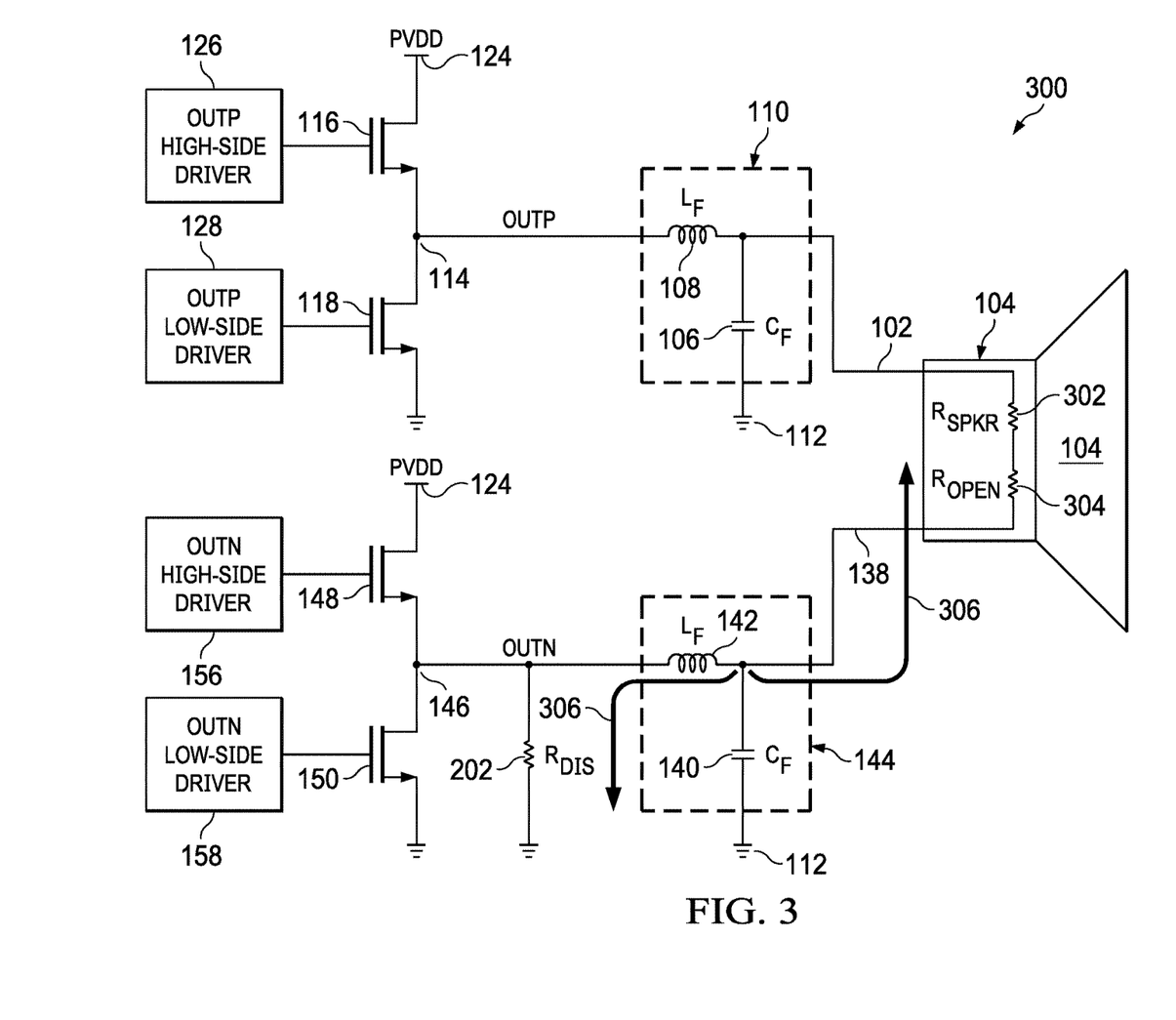
FIG. 3 schematically shows a portion of the example circuit of FIG. 2.

FIG. 3 schematically shows a portion 300 of the example circuit 200 of FIG. 2. As shown in FIG. 3, the speaker 104 can be thought of as roughly equivalent to a pair of resistors connected in series between the OUTP terminal 102 and the OUTN terminal 138: a speaker resistance $R_{SPKR}$ 302 corresponds to a resistance between the terminals 102, 138 when the speaker 104 is functioning properly; and an open load resistance $R_{OPEN}$ 304 corresponds to an additional resistance between the terminals 102, 138 which is zero (0) when there is no unintended open circuit between the terminals 102, 138, and which is larger than a threshold resistance $R_{TH}$ (not shown) when there is an open load fault. Preferably, $R_{DIS}$ of the resistor 202 is much larger than $R_{TH}$, and $R_{TH}$ is much larger than $R_{SPK}$ 302 (as further described below). Accordingly, $R_{DIS} \gg R_{TH} \gg R_{SPK}$. The threshold resistance $R_{TH}$ is further described with respect to FIG. 5.

Figure 4A:
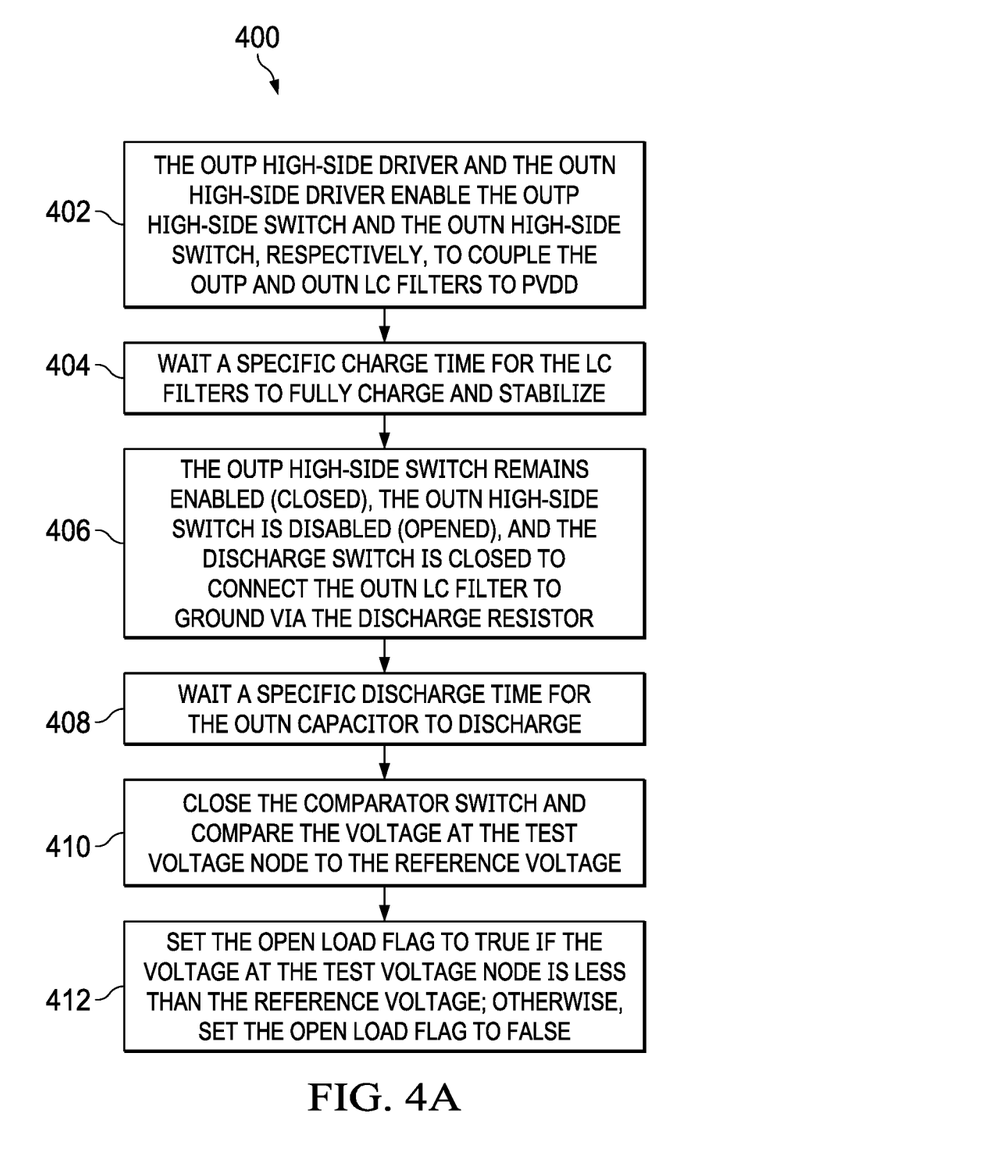
FIG. 4A shows an example of a process for using the circuit of FIG. 2 to determine whether an open load fault is present.

FIG. 4A shows an example of a process 400 for using the circuit 200 of FIG. 2 to determine whether an open load fault is present. To determine whether there is an open load fault using the circuit 200 of FIG. 2, the circuit 200 injects voltage and measures voltage. This avoids using a dedicated current generator configured to produce a precise current which will result in particular expected outputs when there is no open load fault condition between the speaker terminals 102, 138. This also avoids using switches directly connected to the OUTP node 114 or the OUTN node 146, other than those forming the H bridge (OUTP high-side and low-side transistors 116, 118); because the OUTP node 114 and OUTN node 146 operate at high voltage, switches directly connecting to the OUTP node 114 or the OUTN node 146 will generally be isolated switches, which take more device surface area than non-isolated switches. Accordingly, as shown in FIG. 1, switches 120, 122 and 154 (the input switch 120, OUTP comparator switch 122 and OUTN comparator switch 154) are isolated switches. As shown in FIG. 2, switches 206 and 214 (the discharge switch 206 and comparator switch 214) connect to ground 112, meaning that switches 206 and 214 can be, and preferably are, non-isolated switches. Further, in embodiments in which the OUTP node 114 and OUTN node 146 connect to respective chip pins, switches 206 and 214 are connected to the OUTN node 146 via series resistances 202, 204 and 210 (the discharge resistor 202, first OUTN voltage-divider resistor 204 and second OUTN voltage-divider resistor 210). This means that switches 206 and 214 are protected against electrostatic discharge during handling of a chip containing the circuit 200.

Figure 4B:
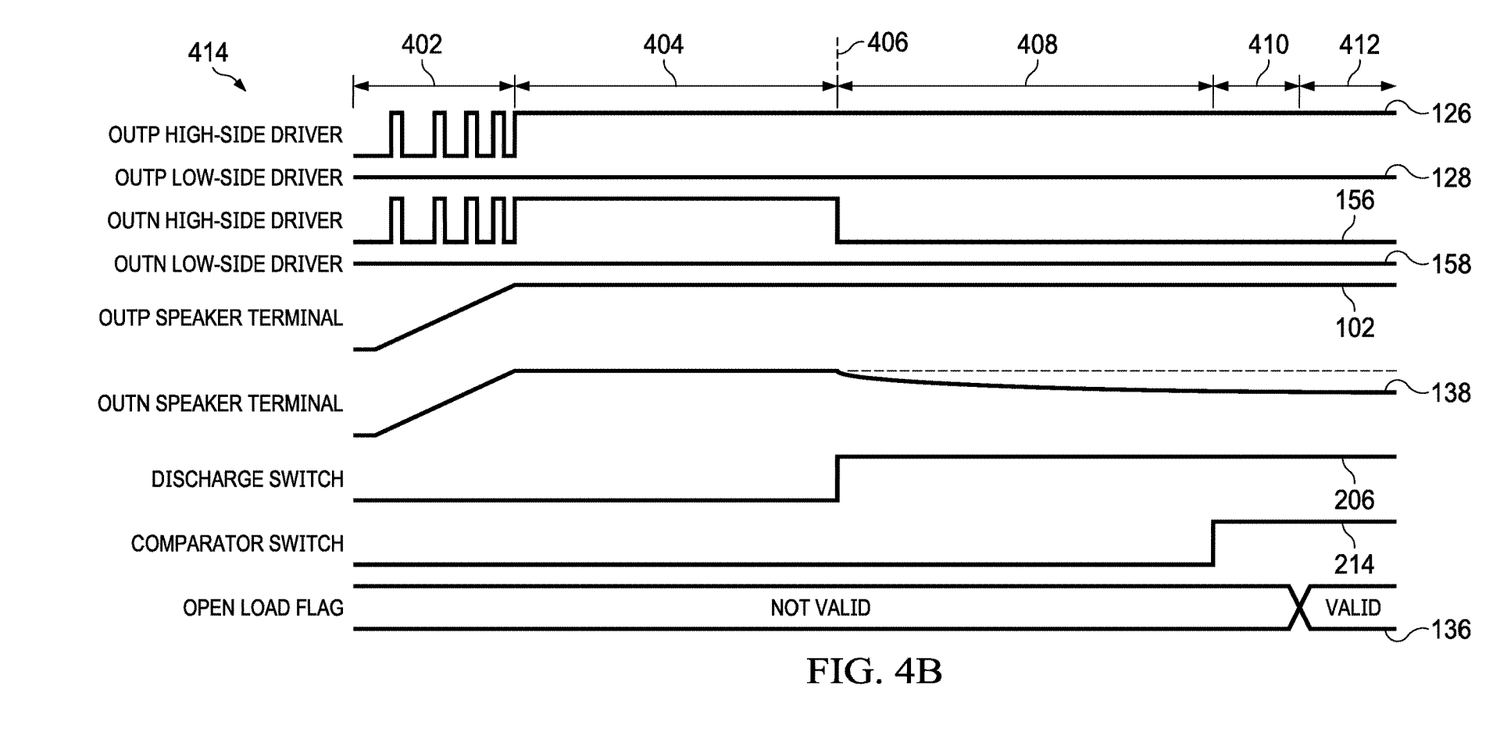
FIG. 4B shows an example of a timing diagram 414 for the circuit 200 of FIG. 2, corresponding to the example process of FIG. 4A.

FIG. 4B shows an example of a timing diagram 414 for the circuit 200 of FIG. 2, corresponding to the example process of FIG. 4A. As shown in FIGS. 4A and 4B, initially, the OUTP high-side driver 126 and the OUTN high-side driver 156 enable the OUTP high-side transistor 116 and the OUTN high-side transistor 148, respectively, to couple the OUTP and OUTN LC filters 110, 144 to PVDD 124 in step 402. This results in the voltages at the OUTP node 114 and the OUTN node 146 being equal to PVDD 124, and to each other. In embodiments as shown in FIG. 4B, step 402 is implemented using a pulse width modulation (PWM)-like pattern of enabling the OUTP high-side transistor 116 and the OUTN high-side transistor 148 (using the OUTP high-side driver 126 and the OUTN high-side driver 156, respectively), to more gradually charge the LC filters 110, 144 and more gradually ramp the voltages at the OUTP terminal 102 and the OUTN terminal 138 of the speaker 104. This can be used to further lower the differential voltage across the speaker terminals 102, 138. In step 404, there is a wait for the LC filters 110, 144 to fully charge and stabilize. The capacitances of the OUTP capacitor 106 and the OUTN capacitor 140 are preferably equal (both $C_F$, as shown in FIG. 3) and the inductances of the OUTP inductor 108 and the OUTN inductor 142 are preferably equal (both $L_F$, as shown in FIG. 3), so that the LC filters 110, 144 charge at equal rates. As a result, there is little or no differential voltage across the speaker 104 (particularly using the PWMlike control pattern shown in FIG. 4B). This reduces the likelihood of voltage spikes across the speaker 104 and reduces the total deflection distance of the speaker membrane during the test process. Accordingly, the likelihood of damage to the speaker 104 during the test process is reduced. After the wait in step 404 for the LC filters 110, 144 to charge and stabilize, the voltages at the terminals 102, 138 are equal.

In step 406, the OUTP high-side transistor 116 remains enabled (closed), the OUTN high-side transistor 148 is disabled (opened), and the discharge switch 206 is closed to provide a discharge path through the OUTN inductor 142 of the OUTN LC filter 144 to ground 112, via the discharge resistor 202. According to the superposition principle, the circuit portion 300 can be viewed as having the pseudo-dc voltage on the OUTP capacitor 106 shorted out (accordingly, the OUTP capacitor 106 shorted), so that only the OUTN capacitor 140 affects transient voltage at the OUTN node 146.

This can also be viewed as the resistance of the speaker 104 $R_{SPK}$ and the open load resistance ROPEN, and the resistance of the discharge resistor 202 $R_{DIS}$, forming a voltage divider. Steps 402 and 404 set up an initial state for the discharge phase, which corresponds to steps 406 and 408. The ratio of the total speaker 104 load ($R_{SPK}+R_{OPEN}$) to the discharge resistor 202 load $R_{DIS}$ determines the final voltage state at the OUTN node 146 following the discharge phase. If there is no open load fault condition, then the final voltage state at the OUTN node 146 will be close to PVDD 124 (the normal load $R_{SPK}$ is much smaller than the discharge resistor resistance $R_{DIS}$, and therefore will generally see a small proportion of the total voltage drop across the various resistances; the low voltage drop also corresponds to low noise produced on the speaker). If there is an open load fault condition, the total speaker 104 load will be larger, making the final voltage state at the OUTN node 146 significantly less than PVDD 124.

Accordingly, the OUTN capacitor 140 can be viewed as discharging across the OUTN inductor 142 and the discharge resistor 202, and across the speaker 104, as shown by the dotted lines 306 in FIG. 3. The OUTN capacitor 140 thus discharges across a total discharge resistance of ($R_{SPK}+R_{OPEN}$)||$R_{DIS}$ (the symbol || indicates parallel resistors). This makes the RC time constant τ for the OUTN capacitor 140:

$$\tau = C_F \times \frac{R_{DIS} \times (R_{OPEN} + R_{SPK})}{R_{DIS} + (R_{OPEN} + R_{SPK})} \quad \text{Equation 1}$$

(If there is an open load fault, then $R_{OPEN}$ is much larger than $R_{SPK}$, and the resistance across which the OUTN capacitor 140 discharges can be approximated as $R_{OPEN}||R_{DIS}$; also, the inductances of the inductors 108, 142 are preferably chosen so that their effects on the discharge time will be low.) If normal load is present (no open load fault), the voltage at the OUTN node 146 will remain (almost) PVDD 124, (nearly) equal to the voltage at the OUTP node 114. However, if there is an open load fault, then the voltage at the OUTN node 146 will decrease. (Recall that OUTN high-side transistor 148 was opened, disconnecting OUTN node 146 from the input voltage 124, in step 406.) This is apparent in light of Ohm's Law (V=I×R) because the resistance $R_{OPEN}$ increases in an open load fault condition while the current is constant. A stabilized value of the voltage at the OUTN node 146 is related to PVDD 124 and the total discharge resistance ($R_{SPK}+R_{OPEN}$)||$R_{DIS}$. Accordingly, the voltage drop across the speaker 104, plus the voltage drop across the discharge resistor 202, will equal the total supplied voltage PVDD 124 (the voltage to which the OUTN capacitor 140 was charged). The voltage across the discharge resistor 202 equals the voltage at the OUTN node 146 $V_{OUTN}$:

$$V_{OUTN} = PVDD \times \frac{R_{DIS}}{R_{DIS} + (R_{OPEN} + R_{SPK})} \quad \text{Equation 2}$$

Because $V_{OUTN}$ is proportional to PVDD, a reference voltage proportional to PVDD can be used to establish a fixed threshold $R_{TH}$ for determining an open load fault. The threshold resistance $R_{TH}$ is further described with respect to FIG. 5.

In step 408, there is a wait of a specific discharge time (described below with respect to FIG. 5 and Equation 8) for the OUTN capacitor 140 to discharge. In step 410, after waiting for the OUTN capacitor 140 to discharge, the discharge switch remains closed, the comparator switch 214 is closed and the voltage at the test voltage node 208, which depends on $V_{OUTN}$, is compared by the comparator 212 with a reference voltage 216 which is proportional to PVDD 124. In step 412, if the voltage at the test voltage node 208 is determined to be less than the reference voltage 216, then the comparator 212 will set the open load flag 218 to indicate an open load fault.

Figure 5:
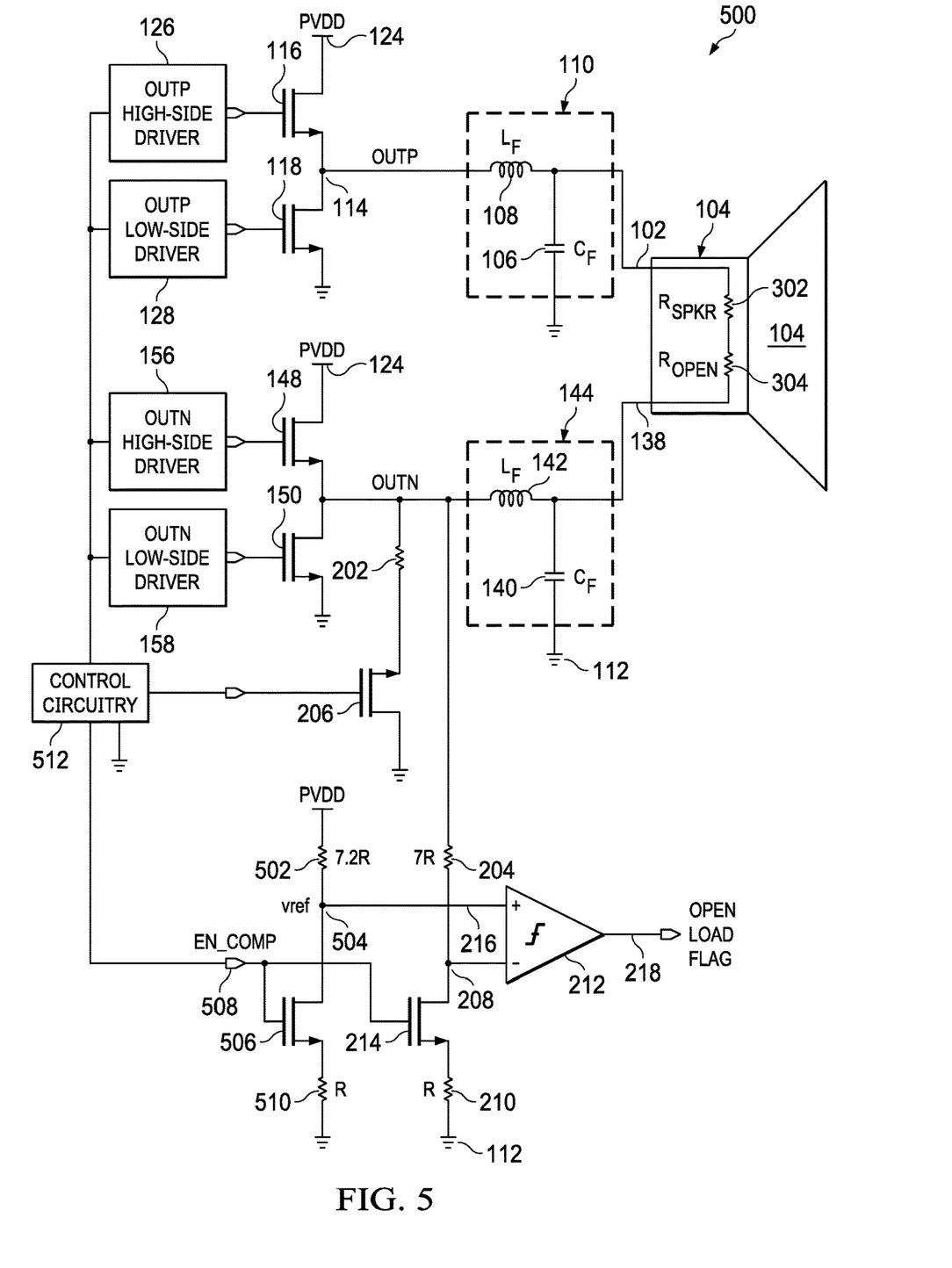
FIG. 5 schematically shows an example circuit which includes the circuit of FIG. 2 and the resistances $R_{SPK}$ and $R_{OPEN}$ described with respect to FIG. 3, along with structure for generating the reference voltage.

FIG. 5 schematically shows an example circuit 500 which includes the circuit 200 of FIG. 2 and the resistances $R_{SPK}$ 302 and $R_{OPEN}$ 304 described with respect to FIG. 3, along with structure for generating the reference voltage 216. The input voltage PVDD 124 is connected to a first terminal of a first vref voltage-divider resistor 502, which has its second terminal connected to a vref node 504. The vref node 504 is also connected to an input (for example, inverting) of the comparator 212 to supply the reference voltage 216 to the comparator 212. The vref node 504 is also connected to a reference voltage switch 506, which is shown by way of example as a transistor having its drain connected to the vref node 504 and its source connected through a second vref voltage-divider resistor 510 to ground. Reference voltage switch 506 preferably is enabled (closed) by a same EN_COMP signal 508 as the comparator switch 214. Enabling the reference voltage switch 506 causes the input voltage PVDD 124 to divide across resistors 502 and 510 and connects the divided voltage, as the reference voltage 216 across resistor 510, to the comparator 212. There is also a control circuitry 512 for controlling the OUTP high-side driver 126, the OUTP low-side driver 128, the OUTN high-side driver 156, the OUTN low-side driver 158, the discharge switch 206, the reference voltage switch 506, and the comparator switch 214 (the latter two by providing the EN_COMP signal 508). The control circuitry 512 is also connected to the ground 112.

In the example shown in FIG. 5, for a base voltage-divider resistance R (which cancels out in relevant calculations, as described below) the first OUTN voltage-divider resistor 204 equals 7R and the second OUTN voltage-divider resistor 210 equals R. Accordingly, the voltage at the test voltage node 208 is $$V_{OUTN} \times \frac{1}{8}.$$

The first OUTN voltage-divider resistor 502 equals 7.2R and the second OUTN voltage-divider resistor 510 equals R. Accordingly, the voltage at the vref node 504 is $$PVDD \times \frac{1}{8.2}.$$

Using equation 2, the comparison made by the comparator 212 can be described as follows (wherein, in Equation 3, CMPR is a function meaning compare the two input parameters shown between parentheses and separated by a comma):

$$CMPR\left(PVDD \times \frac{R_{DIS}}{R_{DIS} + (R_{OPEN} + R_{SPK})} \times \frac{1}{8}, PVDD \times \frac{1}{8.2}\right), \quad \text{Equation 3}$$

The resistance threshold $R_{TH}$ (a minimum open load resistance $R_{OPEN}$ which will cause a voltage at OUTN node 146 indicating an open load fault) can be determined by substituting $R_{TH}$ for $R_{OPEN}$ in Equation 3 and setting the reference voltage 216 equal to the voltage at the test voltage node 208:

$$PVDD \times \frac{R_{DIS}}{R_{DIS} + (R_{TH} + R_{SPK})} \times \frac{1}{8} = PVDD \times \frac{1}{8.2} \quad \text{Equation 4}$$

$$\frac{R_{DIS}}{R_{DIS} + (R_{TH} + R_{SPK})} = \frac{8}{8.2} \quad \text{Equation 5}$$

A scale factor $$k = \frac{8}{8.2}$$

is a ration between a voltage-divider ratio of the voltage-divider resistors 204, 210 used to generate the voltage at the test voltage node 208 from $V_{OUTN}$, and a voltage-divider ratio of the voltage-divider resistors 502, 510 used to generate the reference voltage 216. In the example shown in and described with respect to FIG. 5, the former ratio is $$\frac{1}{8},$$

and the latter ratio is $$\frac{1}{8.2}.$$

As can be seen from Equation 6, k<1. The scale factor k is further used below in determining the discharge time of step 408 (as described with respect to FIG. 4A).

As shown in Equation 5, the resistance threshold $R_{TH}$ is independent of the input voltage PVDD 124 and the base voltage-divider resistance R. Because $R_{TH}$ and $R_{DIS}$ are much larger than $R_{SPK}$ ($R_{TH}+R_{SPK} \approx R_{TH}$), Equation 5 can be rearranged and approximated as shown in Equation 6. For example, if $R_{DIS}$ equals 4200Ω, then $R_{TH} \approx 102Ω$.

$$R_{DIS} \times \left(\frac{1}{k} - 1\right) = R_{DIS} \times \left(\frac{8.2}{8} - 1\right) = R_{DIS} \times \frac{.2}{8} = R_{TH} \quad \text{Equation 6}$$

The discharge time of step 408 is based on the discharge time for the voltage at the OUTN node 146 to drop below a threshold voltage corresponding to $R_{TH}$ when there is an open load fault. Accordingly, the threshold voltage at the OUTN node 146 is a voltage which will result in the comparator 212 indicating an open load fault. This discharge time t for the voltage at the OUTN node 146 is determined as follows:

$$PVDD - PVDD \times \frac{R_{OPEN}}{R_{OPEN} + R_{DIS}} \times \left(1 - e^{-\frac{t}{\tau}}\right) = PVDD \times \frac{1}{k} \quad \text{Equation 7}$$

$$t = -\tau \times \ln\left[k + (k-1) \times \frac{R_{DIS}}{R_{OPEN}}\right], \quad \text{Equation 8}$$

$$\text{where } \tau \approx \frac{R_{OPEN} \times R_{DIS}}{R_{OPEN} + R_{DIS}} \times C_F$$

When $R_{OPEN}$ is less than $R_{TH}$ ($R_{OPEN}<R_{TH}$), there is no solution to Equation 8. When $R_{OPEN}$ equals $R_{TH}$ ($R_{OPEN}=R_{TH}$), t=∞. When $R_{OPEN}$ is greater than $R_{TH}$, then the larger $R_{OPEN}$ is, the shorter the required discharge time t is for the voltage at the test voltage node 208 to fall below the voltage at the reference voltage node 504 (indicating the open load fault). Conversely, the closer $R_{OPEN}$ is to $R_{TH}$, the longer the required discharge time t will be. For example, the discharge time for LC filters to charge and stabilize (step 404 in FIG. 4A) can be 2 ms, and the discharge time for the OUTN capacitor to discharge (step 408 in FIG. 4A), as discussed with respect to FIG. 5 and Equation 8, can be 6 ms.

Accordingly, if $R_{OPEN}$ is large compared to $R_{TH}$, settle time (total RC discharge time) will be long, but open load fault detection time (relating, in part, to initial discharge rate) will be short. Also, if $R_{OPEN}$ is near $R_{TH}$, settle time will be short, but open load fault detection time will be long.

Figure 6:
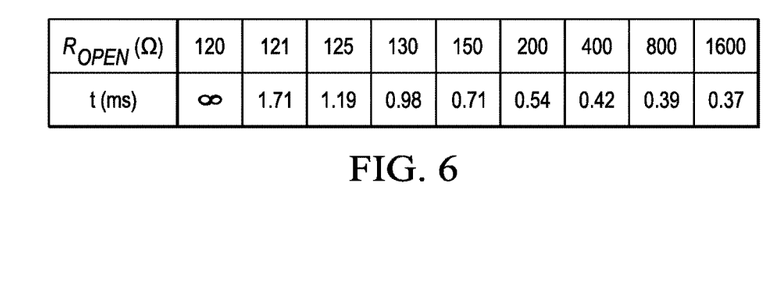
FIG. 6 shows an example table of values for $R_{OPEN}$ in ohms (Ω) with corresponding values of discharge time t in milliseconds (ms).

FIG. 6 shows an example table of values for $R_{OPEN}$ in ohms (Ω) with corresponding values of discharge time t in milliseconds (ms). The values in the table shown in FIG. 6 are dependent on the following assumed values: $R_{TH}$=120Ω;

$$k = \frac{8}{8.2};$$

$R_{DIS}$=4800; and $C_F$=3 μF ($C_F$ is the capacitance of the OUTP capacitor 106 and the OUTN capacitor 140). Note that if the speaker 104 is completely disconnected, such as if one of the terminals 102, 138 is disconnected, then $R_{OPEN}$ will be effectively infinite. However, as shown by the values in FIG. 6, a "hard open" fault (complete disconnection, corresponding to infinite resistance $R_{OPEN}$) can be asserted quickly; and generally, relatively high resistance open load faults can be asserted quickly, before $V_{OUTN}$ settles. This is because, though $V_{OUTN}$ has not yet settled, the voltage at the test voltage node 208 has already fallen below the reference voltage 216. Preferably, a wait time longer than a typical or expected minimum required discharge time is used to avoid false negative results (false indications that there is no open load fault).

Modifications are possible in the described embodiments, and other embodiments are possible, within the scope of the claims.

In some embodiments, other voltage-divider values are used than those described above.

In some embodiments, other open load detection threshold resistances $R_{TH}$ are used than those described above.

In some embodiments, low-side transistors and low-side drivers are not used.

In some embodiments, the no-fault resistance of the speaker ($R_{SPK}$) is included in calculations of threshold resistance $R_{TH}$ and minimum discharge time

What is claimed is:

1. Circuitry for detecting an open load fault, comprising:
   an input voltage terminal configured to receive an input voltage;
   a first switch having a first terminal and second terminal wherein the first terminal is coupled to the input voltage terminal;
   a first inductor-capacitor (LC) filter having an input terminal and an output terminal wherein the input terminal is coupled to the second terminal of the first switch;
   a second switch having a first terminal and second terminal;
   a second LC filter having an input terminal and an output terminal;
   a discharge resistor having a first terminal and a second terminal wherein the first terminal is coupled to the output of the second LC filter;
   a first load terminal coupled to the output of the first LC filter, and a second load terminal coupled to the input of the second LC filter;
   a third switch having a first terminal and a second terminal wherein the first terminal is coupled to the second terminal of the discharge resistor and the second terminal is coupled to ground;
   a first voltage-divider resistor having a first terminal and a second terminal wherein the first terminal is coupled to the output of the second LC filter;
   a comparator having a first input, a second input and an output wherein the second input is coupled to the second terminal of the first voltage-divider resistor;
   a second voltage-divider resistor having a first terminal and a second terminal wherein the first terminal is coupled to the second terminal of the first voltage-divider resistor;
   a comparator switch having a first terminal and a second terminal wherein the first terminal is coupled to the second terminal of the second voltage-divider resistor and the second terminal is coupled to ground; and
   a reference voltage circuitry configured to produce a reference voltage and to provide the reference voltage to a second input of the comparator.

2. The circuitry of claim 1 further comprising:
   a control circuitry configured to control:
   the first switch to close until the first LC filter is charged to the input voltage, and the second switch to close until the second LC filter is charged to the input voltage;
   the first switch to remain closed, the second switch to open, and the third switch to close after the first and second LC filters are charged to the input voltage, and until a voltage across the discharge resistor remains constant; and
   the comparator switch to close for a period of time after the voltage across the discharge resistor remains constant;
   wherein the comparator is configured to output an Open Load Flag signal, the Open Load Flag signal indicating an open load fault in a test circuit, when a voltage at the second terminal of the first voltage-divider resistor is below the reference voltage while the comparator switch is closed.

3. The circuitry of claim 2, the reference voltage circuitry comprising:
   a first vref voltage-divider resistor coupled to the input voltage and to a reference voltage terminal, the reference voltage terminal coupled to the second input to the comparator and to a reference voltage switch; and
   a second vref voltage-divider resistor coupled to the ground and to the reference voltage switch;
   wherein the control circuitry is configured to control the reference voltage switch to close when it controls the comparator switch to close, and wherein the reference voltage circuitry is configured to provide the reference voltage from the reference voltage terminal to the comparator when the reference voltage switch is closed.

4. The circuitry of claim 3, wherein the first test voltage-divider resistor has a resistance $R_{test\_1}$, the second test voltage-divider resistor has a resistance $R_{test\_2}$, the first vref voltage divider-resistor has a resistance $R_{vref\_1}$, the second voltage-divider resistor has a resistance $R_{vref\_2}$, and the discharge resistor has a resistance $R_{DIS}$;
   wherein the test circuit includes, in series between the first and second load terminals, a constant resistance $R_{SPK}$ and a resistance $R_{OPEN}$ corresponding to open load faults in the test circuit;
   wherein the comparator is configured to output the Open Load Flag as TRUE when the voltage at the test voltage terminal falls below a threshold voltage corresponding to a value of $R_{OPEN}$ of approximately $R_{TH}$ while the comparator switch is closed, $R_{TH}$ defined as:

$$R_{TH} = \left( \frac{R_{vref\_1}}{R_{vref\_1} + R_{vref\_2}} \bigg/ \frac{R_{test\_1}}{R_{test\_1} + R_{test\_2}} - 1 \right) \times R_{DIS}.$$

5. The circuitry of claim 4, wherein the control circuitry is configured to close the comparator switch for longer than a time $t_{MIN}$ corresponding to a minimum expected time for the voltage at the test voltage terminal to fall below $R_{TH}$ when there is an open load fault in the test circuit, $t_{MIN}$ being derived by using a minimum expected value of $R_{OPEN}$ when there is an open load fault in the test circuit, as follows:

$$k = \frac{R_{test\_1}}{R_{test\_1} + R_{test\_2}} \bigg/ \frac{R_{vref\_1}}{R_{vref\_1} + R_{vref\_2}}$$

$$\tau = C_F \times \frac{R_{DIS} \times (R_{OPEN} + R_{SPK})}{R_{DIS} + (R_{OPEN} + R_{SPK})}$$

where $C_F$=capacitance of the capacitor in the first LC filter and capacitance of the capacitor in the second LC filter, and $$tMIN = -\tau \times \ln\left[ k + (k-1) \times \frac{R_{DIS}}{R_{OPEN}} \right].$$

6. The circuitry of claim 1, wherein an inductance of the first LC filter equals an inductance of the second LC filter.

7. The circuitry of claim 1, wherein a capacitance of the first LC filter equals a capacitance of the second LC filter.

8. The circuitry of claim 1, wherein a resistance of the discharge resistor is greater than a resistance of the test circuit when there is not an open load fault in the test circuit.

9. The circuitry of claim 1, wherein the reference voltage circuitry is configured to produce the reference voltage so that it is proportional to the input voltage.

10. The circuitry of claim 1, wherein the first and second switches, the first and second LC filters, and the first and second terminals are included in an H bridge.

11. A method of determining whether there is an open in a test circuit, the method comprising:
   a) closing a first switch to couple an input voltage to a first LC filter in which a first capacitor is coupled to a ground, wherein the first LC filter is coupled to a first terminal of the test circuit;
   b) closing a second switch to couple the input voltage to a second LC filter in which a second capacitor is coupled to the ground, wherein the second LC filter is coupled to a second terminal coupled to the test circuit;
   c) waiting for the first and second LC filters to charge to the input voltage;
   d) keeping the first switch closed, opening the second switch, and discharging the second capacitor across a discharge resistor for a discharge time;
   e) comparing a voltage across the discharge resistor to a reference voltage;
   f) when the voltage across the discharge resistor falls below the reference voltage, outputting an indication that there is an open load fault in the test circuit.

12. The method of claim 11, wherein the step a) is performed simultaneously with the step b).

13. The method of claim 11, wherein the voltage across the discharge resistor $V_{DIS}$ is voltage-divided with a ratio A, and the reference voltage $V_{REF}$ is voltage-divided with a ratio B, so that the step f) compares a voltage $$\frac{V_{DIS}}{A}$$

to a voltage $$\frac{V_{REF}}{B}.$$

14. The method of claim 13, wherein a first test voltage-divider resistor has a resistance $R_{test\_1}$, a second test voltage-divider resistor has a resistance $R_{test\_2}$, a first vref voltage divider-resistor has a resistance $R_{vref\_1}$, a second voltage-divider resistor has a resistance $R_{vref\_2}$, the discharge resistor has a resistance $R_{DIS}$, and the ratios A and B are defined as follows:

$$A = \frac{R_{test\_1}}{R_{test\_1} + R_{test\_2}}$$

$$B = \frac{R_{test\_1}}{R_{test\_1} + R_{test\_2}}.$$

15. The method of claim 13, wherein the test circuit includes, in series between the first and second terminals, a constant resistance $R_{SPK}$ and a resistance $R_{OPEN}$ corresponding to open load faults in the test circuit; and wherein the discharge resistor has a resistance of $R_{DIS}$, and $$\frac{V_{REF}}{B}$$

corresponds to a value of $R_{OPEN}$ of $R_{TH}$, $R_{TH}$ being defined as:

$$R_{TH} = \left(\frac{B}{A} - 1\right) \times R_{DIS}.$$

16. The method of claim 11, wherein the first LC filter and the second LC filter charge at the same rate.

17. The method of claim 11, wherein the reference voltage is proportional to the input voltage.

* * * * *